United States Patent
Thorup et al.

(10) Patent No.: US 8,686,493 B2
(45) Date of Patent: Apr. 1, 2014

(54) HIGH DENSITY FET WITH INTEGRATED SCHOTTKY

(75) Inventors: Paul Thorup, West Jordan, UT (US); Christopher Lawrence Rexer, Mountaintop, PA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 864 days.

(21) Appl. No.: 12/242,633

(22) Filed: Sep. 30, 2008

(65) Prior Publication Data

US 2009/0090966 A1    Apr. 9, 2009

Related U.S. Application Data

(60) Provisional application No. 60/977,635, filed on Oct. 4, 2007.

(51) Int. Cl.
    *H01L 29/66* (2006.01)
(52) U.S. Cl.
    USPC ............................ 257/330; 257/328; 257/329
(58) Field of Classification Search
    USPC ........................ 257/328–330, E27.081, 409
    See application file for complete search history.

(56) References Cited

U.S. PATENT DOCUMENTS

| | | | |
|---|---|---|---|
| 4,823,172 A | 4/1989 | Mihara | |
| 4,941,026 A | 7/1990 | Temple | |
| 5,998,833 A | 12/1999 | Baliga | |
| 6,351,018 B1 | 2/2002 | Sapp | |
| 6,621,107 B2 | 9/2003 | Blanchard et al. | |
| 6,686,614 B2 | 2/2004 | Tihanyi | |
| 6,998,678 B2 | 2/2006 | Werner et al. | |
| 7,446,374 B2 | 11/2008 | Thorup et al. | |
| 2005/0218472 A1 | 10/2005 | Okada et al. | |
| 2006/0138533 A1 | 6/2006 | Hirler et al. | |
| 2006/0267090 A1 | 11/2006 | Sapp et al. | |
| 2007/0221952 A1 | 9/2007 | Thorup et al. | |

FOREIGN PATENT DOCUMENTS

CN    1677687 A    5/2005

OTHER PUBLICATIONS

International Search Report and Written Opinion of PCT Application No. PCT/US08/78612, date of mailing Dec. 8, 2008, 12 pages total.
China State Intellectual Property Office office action for patent application CN200880119292.3 (Jul. 22, 2011).
Office Action for Chinese Patent Patent Application No. 200880119292.3, mailed on Apr. 26, 2012, 4 pages.

*Primary Examiner* — Ajay K Arora

(57) ABSTRACT

A semiconductor structure includes a monolithically integrated trench FET and Schottky diode. The semiconductor structure further includes a plurality of trenches extending into a semiconductor region. A stack of gate and shield electrodes are disposed in each trench. Body regions extend over the semiconductor region between adjacent trenches, with a source region extending over each body region. A recess having tapered edges extends between every two adjacent trenches from upper corners of the two adjacent trenches through the body region and terminating in the semiconductor region below the body region. An interconnect layer extends into each recess to electrically contact tapered sidewalls of the source regions and the body regions, and to contact the semiconductor region along a bottom of each recess to form a Schottky contact therebetween.

18 Claims, 11 Drawing Sheets

HIGH DENSITY FET WITH INTEGRATED SCHOTTKY

CROSS-REFERENCES TO RELATED APPLICATIONS

This application claims the benefit of U.S. Provisional Application No. 60/977,635, filed on Oct. 4, 2007, which is incorporated herein by reference in its entirety for all purposes.

BACKGROUND OF THE INVENTION

The present invention relates in general to semiconductor power device technology, and in particular to structures and methods for forming a monolithically integrated trench gate field effect transistor (FET) and Schottky diode.

In today's electronic devices a power FET is often used in power conversion applications such as DC-DC converters. For many years, a Schottky diode was implemented external to the FET switch package to reduce power consumption. As shown in FIG. 1, FET 101 includes an internal diode 102 commonly referred to as body diode. During switching operations, the body diode can conduct current. As shown in FIG. 1, Schottky diode 104 is in parallel with body diode 102 of FET 101. Because a Schottky diode has lower forward voltage than the body diode, Schottky diode 104 turns on before body diode 102 turns on thus improving switching losses.

More recently, some manufacturers have introduced products in which discrete Schottky diodes are co-packaged with discrete power FET devices. There have also been monolithic implementations of power FETs with Schottky diode. An example of a conventional monolithically integrated trench FET and Schottky diode is shown in FIG. 2. A Schottky diode 210 is formed between two trenches 200-3 and 200-4 surrounded by trench FET cells on either side. N-type substrate 202 forms the cathode terminal of Schottky diode 210 as well as the drain terminal of the trench FET. Conductive layer 218 provides the diode anode terminal and also serves as the source interconnect layer for FET cells. The gate electrode in trenches 200-1, 200-2, 200-3, 200-4 and 200-5 are connected together in a third dimension and are therefore similarly driven. The trench FET cells further include body regions 208 with source region 212 and heavy body regions 214 therein.

The Schottky diodes in FIG. 2 are interspersed between trench FET cells. As a result, the Schottky diodes can consume a significant portion of the active area, resulting in lower current ratings or a large die size. This can be undesirable in certain device applications. There is therefore a need for a monolithically and densely integrated Schottky diode and trench gate FET with superior performance characteristics.

BRIEF SUMMARY OF THE INVENTION

In accordance with an embodiment of the invention, a semiconductor structure includes a monolithically integrated trench FET and Schottky diode. The semiconductor structure further includes a plurality of trenches extending into a semiconductor region of a first conductivity type. A shield electrode is disposed in a lower portion of each trench, the shield electrode being insulated from the semiconductor region by a shield dielectric. An inter-electrode dielectric overlies the shield electrode in each trench. A gate dielectric lines upper trench sidewalls of each trench. A gate electrode is disposed in an upper portion of each trench over the inter-electrode dielectric. Body regions of a second conductivity type extend over the semiconductor region between adjacent trenches. A source region of the first conductivity type extends over each body region. A recess having tapered edges extends between every two adjacent trenches. Each recess further extends from upper corners of the two adjacent trenches through the body region and terminates in the semiconductor region below the body region. An interconnect layer extends into each recess to electrically contact tapered sidewalls of the source regions and the body regions. The interconnect layer further contacts the semiconductor region along a bottom of each recess to form a Schottky contact therebetween. The interconnect layer forms an anode terminal of the Schottky diode and a source electrode of the FET.

In accordance with another embodiment of the invention, a method for forming a semiconductor structure comprising a monolithically integrated trench FET and Schottky diode includes the following steps. A plurality of trenches are formed extending into a semiconductor region of a first conductivity type. A shield electrode is formed in a bottom portion of each trench. A gate electrode is formed over the shield electrode in each trench, the gate electrode being insulated from the shield electrode. A body region of a second conductivity type is formed in the semiconductor region. Doped regions of the first conductivity type are formed in the body region, each doped region laterally extending from one trench sidewall to a sidewall of an adjacent trench. A recess is formed between every two adjacent trenches such that each recess has tapered edges and extends from upper corners of the two adjacent trenches through the doped region and the body region and terminates in the semiconductor region below the body region, and each recess divides the doped region through which it extends into two doped regions, each of the two doped regions forming a source region. An interconnect layer is formed extending into each recess to electrically contact tapered sidewalls of the source regions and the body regions, and to further contact the semiconductor region along a bottom of each recess to form a Schottky contact therebetween. The interconnect layer forms an anode terminal of the Schottky diode and a source electrode of the FET.

In accordance with yet another embodiment of the invention, a semiconductor structure includes a monolithically integrated trench FET and Schottky diode. The semiconductor structure further includes a plurality of trenches extending into a semiconductor region of a first conductivity type. A gate electrode is disposed in each trench. First and second body regions of a second conductivity type extend over the semiconductor region between first and second pair of adjacent trenches, respectively. A source region of the first conductivity type extends over the first body region. A recess extends between each of the first and second adjacent trenches and terminates in the semiconductor region at a depth below the first and second body regions. An interconnect layer extends into each recess to electrically contact the source region and the first and second body regions, the interconnect layer further contacting the semiconductor region along a bottom of each recess to form a Schottky contact therebetween.

In accordance with still another embodiment of the invention, a method for forming a semiconductor structure comprising a monolithically integrated trench FET and Schottky diode includes the following steps. A plurality of trenches extending into a semiconductor region of a first conductivity type are formed. A gate electrode is formed in each trench. First and second body regions are formed in the semiconductor region between a first pair of adjacent trenches and a second pair of adjacent trenches, respectively. A doped region of the first conductivity type is formed in the first body region but not in the second body region. A recess is formed between each of the first and second adjacent trenches with each recess terminating in the semiconductor region below the first and second body regions. The recess between the first adjacent trenches dividing the doped region into two doped regions with each of the two doped regions forming a source region. An interconnect layer is formed extending into each recess to electrically contact sidewalls of the source regions and the first and second body regions, and to further contact the semiconductor region along a bottom of each recess to form a Schottky contact therebetween.

In accordance with still another embodiment, a semiconductor structure includes a monolithically integrated trench FET and Schottky diode. The semiconductor structure further includes a plurality of trenches extending into a semiconductor region of a first conductivity type. A gate electrode is disposed in each trench. First and second body regions of a second conductivity type extend over the semiconductor region between a first and second pair of adjacent trenches, respectively. Source regions of the first conductivity type extend over the first body region. A first recess extends between the first pair of trenches and terminates in the first body region at a depth below the source regions. A second recess extends between the second pair of trenches and terminates in the semiconductor region at a depth below the first, second and third body regions. An interconnect layer extends into the first and second recesses to electrically contact the source regions and the first and second body regions. The interconnect layer further contacts the semiconductor region along a bottom of the second recess to form a Schottky contact therebetween. The interconnect layer forms an anode terminal of the Schottky diode and a source electrode of the FET.

In accordance with still another embodiment, a DC-DC converter includes a DC power source, a PWM controller, and a first FET having a gate terminal coupled to the PWM controller and a first terminal coupled to the DC power source. The converter further includes a monolithically integrated trench FET and Schottky diode having a gate electrode coupled to the PWM controller, a drain electrode coupled to a second terminal of the first FET, and a source terminal coupled to a ground terminal. The monolithically integrated trench FET and Schottky diode includes a plurality of trenches extending into a semiconductor region of a first conductivity type. A shield electrode is disposed in a lower portion of each trench such that the shield electrode is insulated from the semiconductor region by a shield dielectric. An inter-electrode dielectric overlies the shield electrode in each trench. A gate dielectric lines upper trench sidewalls of each trench. A gate electrode is disposed in an upper portion of each trench over the inter-electrode dielectric. Body regions of a second conductivity type extend over the semiconductor region between adjacent trenches. A source region of the first conductivity type extends over each body region. A recess having tapered edges extends between every two adjacent trenches. Each recess further extends from upper corners of the two adjacent trenches through the body region and terminates in the semiconductor region below the body region. An interconnect layer extends into each recess to electrically contact tapered sidewalls of the source regions and the body regions. The interconnect layer further contacts the semiconductor region along a bottom of each recess to form a Schottky contact therebetween.

A further understanding of the nature and the advantages of the invention disclosed herein may be realized by reference to the remaining portions of the specification and the attached drawings.

DETAILED DESCRIPTION OF THE INVENTION

In accordance with embodiments of the invention, various techniques are described for forming a semiconductor structure including a monolithically integrated trench FET and Schottky diode. In one embodiment, a simple process is provided for forming a Schottky diode optimally integrated with a shielded gate trench FET in a single cell which can be repeated many times in an array of such cells. A deep dimple recess is formed to reach the drain region of the trench FET below the body region and form a Schottky diode. Minimal to no active area is sacrificed in integrating the Schottky diode, yet the total Schottky diode area is large enough to handle the diode forward conduction. The FET body diode does not turn on, eliminating reverse recovery losses. Further, because of Schottky diode's lower forward voltage drop compared to that of the FET body diode, power losses are reduced. Additionally, the shield electrode is electrically connected to the source of the FET to reduce device capacitive coupling, such as Qgd.

Moreover, the Schottky diode is integrated with the FET such that the Schottky contact is formed below the FET body regions. This advantageously diverts the avalanche current away from the source regions toward the Schottky regions, preventing the parasitic bipolar transistor from turning on. The device ruggedness is thus improved. This feature of the invention also eliminates, for the most part, the need for heavy body regions typically required in each FET cell of prior art structures to prevent the parasitic bipolar transistor from turning on. In some embodiments, islands of heavy body regions can be incorporated intermittently and far apart from one another merely to ensure good source metal to body region contact. In essence, the heavy body regions required in prior art trench FETs are, for the most part, replaced with Schottky diode. Accordingly, no additional silicon area is allocated to the Schottky diode. In alternative embodiments, the heavy body regions may not be needed and can be completely eliminated. In another embodiment, techniques are provided for selecting a ratio of the FET and Schottky diode areas while reducing device capacitive coupling.

Figure 3A:
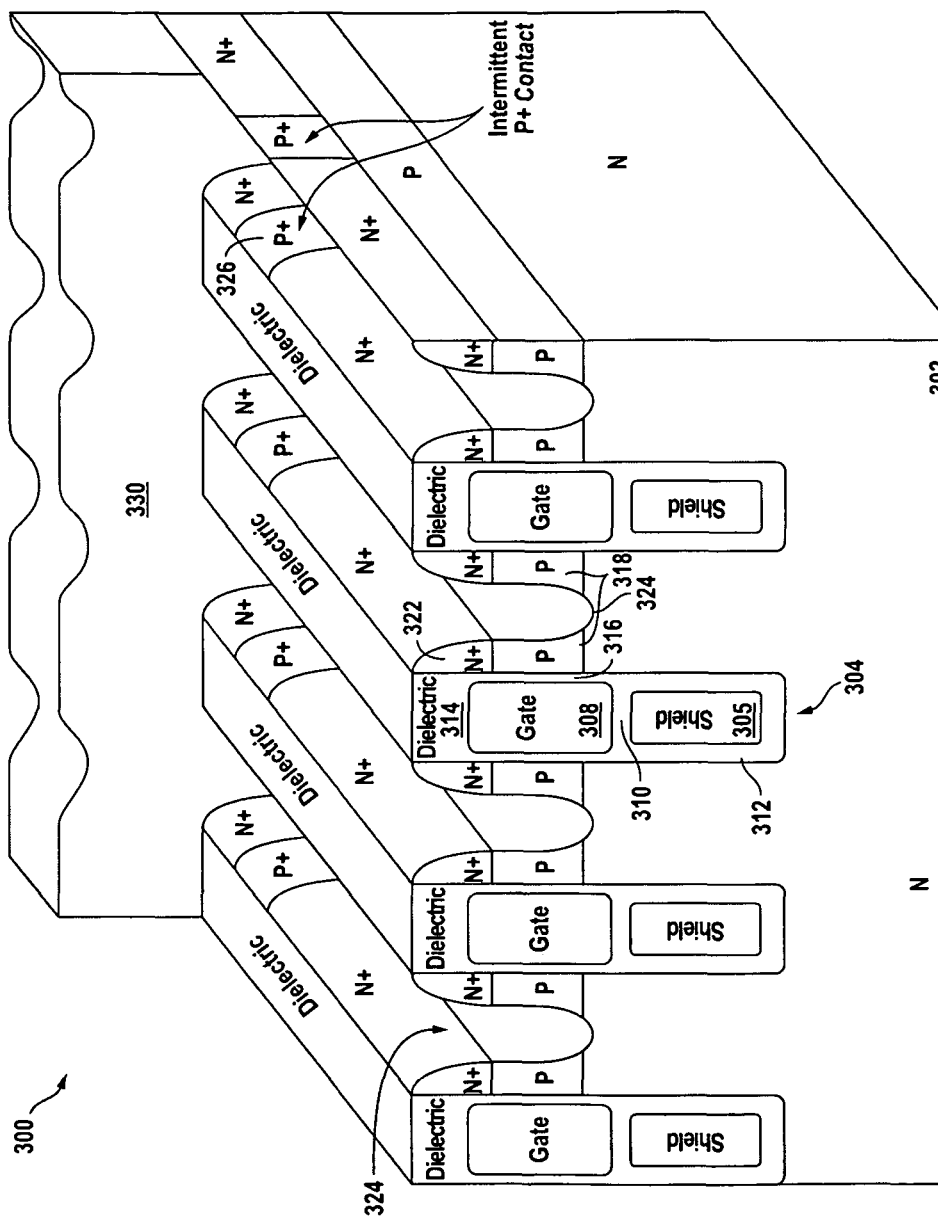
FIG. 3A is a simplified isometric view of a portion of an array of stripe-shaped cells of monolithically integrated shielded gate FET and Schottky diode in accordance with an exemplary embodiment of the invention.

FIG. 3A is an exemplary simplified isometric view of a portion of an array of stripe-shaped cells each having a trench FET and a Schottky diode integrated therein, in accordance with an embodiment of the invention. A doped N-type (N) drift region 302 overlies an N-type silicon substrate (not shown) which has a higher doping concentration (N++) than drift region 302. In certain embodiments, a thick metal contact layer is formed under the silicon substrate (not shown). A plurality of trenches 304 extend to a predetermined depth within drift region 302. A shield electrode 305 and an overlying gate electrode 308 are embedded in each trench 304. In one embodiment, shield electrodes 305 and gate electrodes 308 comprise polysilicon. An inter-electrode dielectric 310 insulates the gate and shield electrodes from one another. Shield dielectric layer 312 lines lower sidewalls and bottom of each trench 304, and insulates shield electrodes 305 from surrounding drift region 302. A gate dielectric 316, which is thinner than shield dielectric 312, lines the upper sidewalls of trenches 304. A dielectric cap 314 extends over each gate electrode 308. In one embodiment, shield electrodes 305 are electrically connected to source regions along a third dimension, and thus are biased to the same potential as the source regions during operation. In other embodiments, shield electrodes 305 are electrically tied to gate electrodes 308 along a third dimension, or are allowed to float.

Two P-type body regions 318, separated by recess dimple region 324, are located between every two adjacent trenches 304. Each body region 318 extends along one trench sidewall. A highly doped N-type source region 322 is located directly above each body region 318. Source regions 322 vertically overlap gate electrode 308, and possess a rounded outer profile due to the presence of recess dimples 324. Each recess dimple 324 extends below corresponding body regions 318 between every two adjacent trenches. As shown, source regions 322 and body regions 318 together form the rounded sidewalls of dimples 324, and the bottom of dimples 324 extends into drift region 302. In one embodiment, drift region 302 is an N epitaxial layer in which body regions 318 and source regions 322 are formed. When FET 300 is turned on, a vertical channel is formed in each body region 318 between each source region 322 and drift region 302 along trench sidewalls.

An interconnect material 330, which is peeled back in FIG. 3A to expose the underlying regions, fills dimples 324 and extends over dielectric caps 314. Interconnect material 330 electrically contacts drift region 302 along the bottom of dimples 324, thus forming a Schottky contact. Interconnect material 330 also serves as the top-side source interconnect, electrically contacting source regions 322 and heavy body regions 326.

In an alternative embodiment, a Schottky barrier metal film can be formed at the bottom of recess dimples 324 for forming Schottky contacts with the drift region, and a second metal, such as copper, can be used to fill dimples 324 and extends over dielectric caps serve as the top-side source interconnect, electrically contacting source regions 322 and body regions 326. In one specific embodiment, the Schottky barrier metal film includes titanium tungsten (TiW) or titanium nitride (TiNi).

Figure 4:
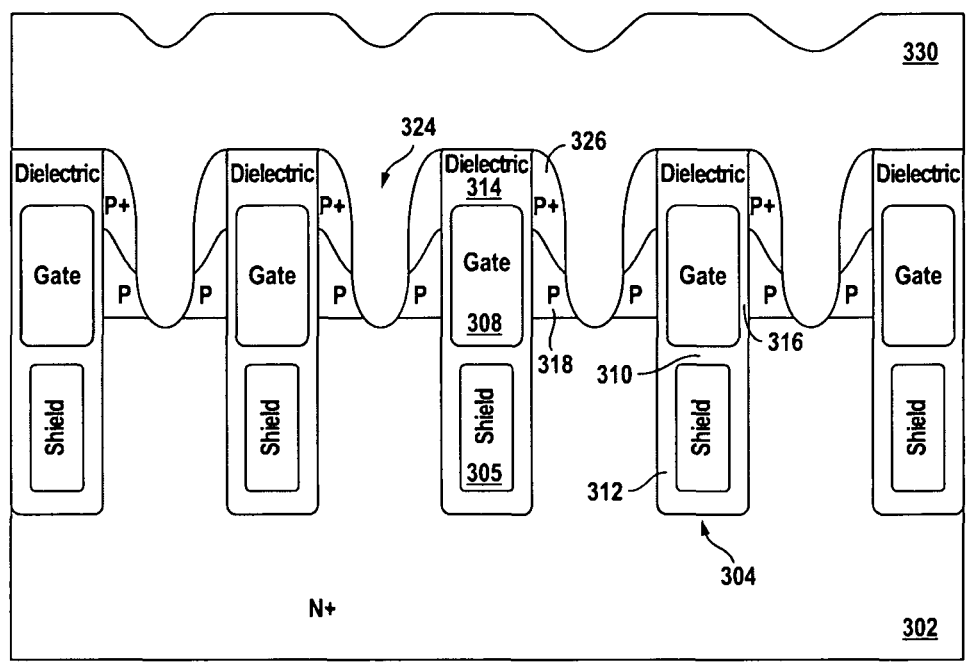
FIG. 4 shows a simplified cross-section view along heavy body regions 326 in FIG. 3A.

In some embodiments, islands of heavy body P+ regions 326 are formed intermittently along the cell stripes, as shown. This is more clearly shown in FIG. 4 which is a cross-section view through heavy body regions 326 of the structure in FIG. 3A. The cross section view in FIG. 4 is, for the most part, similar to the cross section view along the face of the isometric view in FIG. 3A except that in FIG. 4 the two source regions between every two adjacent trenches are replaced with one heavy body region 326.

Figure 1:
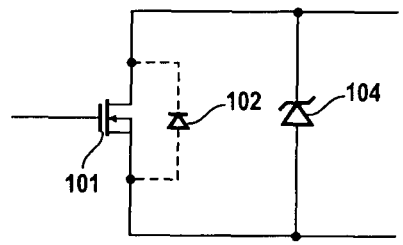
FIG. 1 is a circuit diagram illustrating a FET with a Schottky diode.
Figure 2:
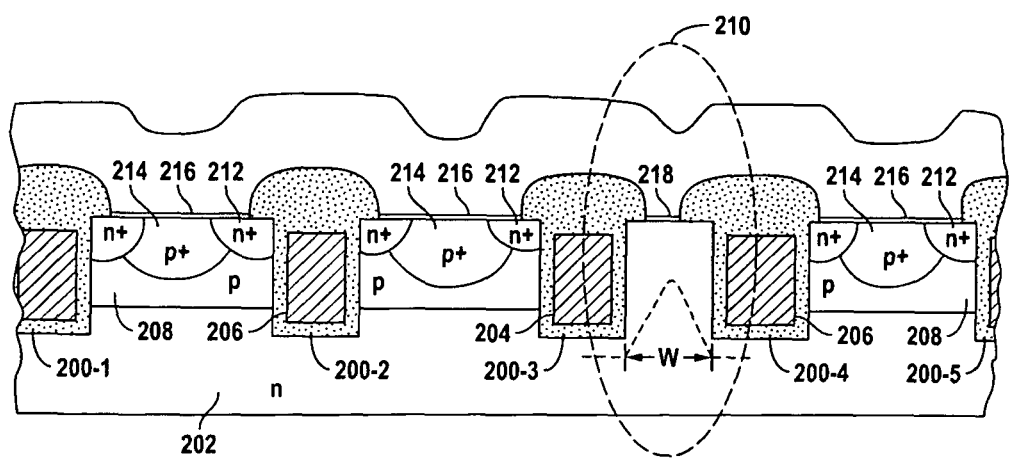
FIG. 2 shows a cross-sectional view of a conventional monolithically integrated trench FET and Schottky diode.

Referring back to FIG. 3A, the intermittent placing of heavy body regions 326 differs from conventional implementations where heavy body regions extend along the entire length of the cell stripes between two adjacent source regions as in the prior art FIG. 2 structure. Continuous heavy body regions are not needed in the FIG. 3A structure because of the manner in which the Schottky diode is integrated with the trench FET. As can be seen in FIG. 3A, by extending dimples 324 well below source regions 322, the Schottky contacts are formed well below source regions 322. With the Schottky contacts positioned well below source regions 322, the avalanche current is diverted away from source regions 322 toward the Schottky regions, thus preventing the parasitic bipolar transistor from turning on. This eliminates the need for continuous heavy body regions along the cell stripes typically required in prior art structures. Instead, islands of heavy body regions 326 are incorporated intermittently and far apart from one other along the cell stripes to ensure good source metal 330 to body region 318 contact. With the continuous heavy body regions replaced, for the most part, with Schottky regions, no additional silicon area needs to be allocated to the Schottky diode. Thus no silicon area is sacrificed in integrating the Schottky diode.

In some embodiments, the placement frequency of heavy body regions 326 along the stripes is dictated by the device switching requirements. For faster switching devices, heavy body regions are placed more frequently along the stripes. For these devices, additional silicon area may need to be allocated to Schottky diode (e.g., by increasing the cell pitch). For slower switching devices, fewer heavy body regions are required along the stripes. For these devices, placing a heavy body region at each end of a stripe may suffice, thus maximizing the Schottky diode area.

The presence of shield electrodes 305 enables the doping concentration of drift region 302 to be increased for the same breakdown voltage (as compared to trench gate FETs with no shield electrodes), thus reducing the device on-resistance. The higher doping concentration of drift region 302 may require incorporating an implant region in drift region 302 along the bottom of recesses 324 to adjust the doping concentration at the Schottky contact in order to insure the integrity of the Schottky contact.

Figure 3B:
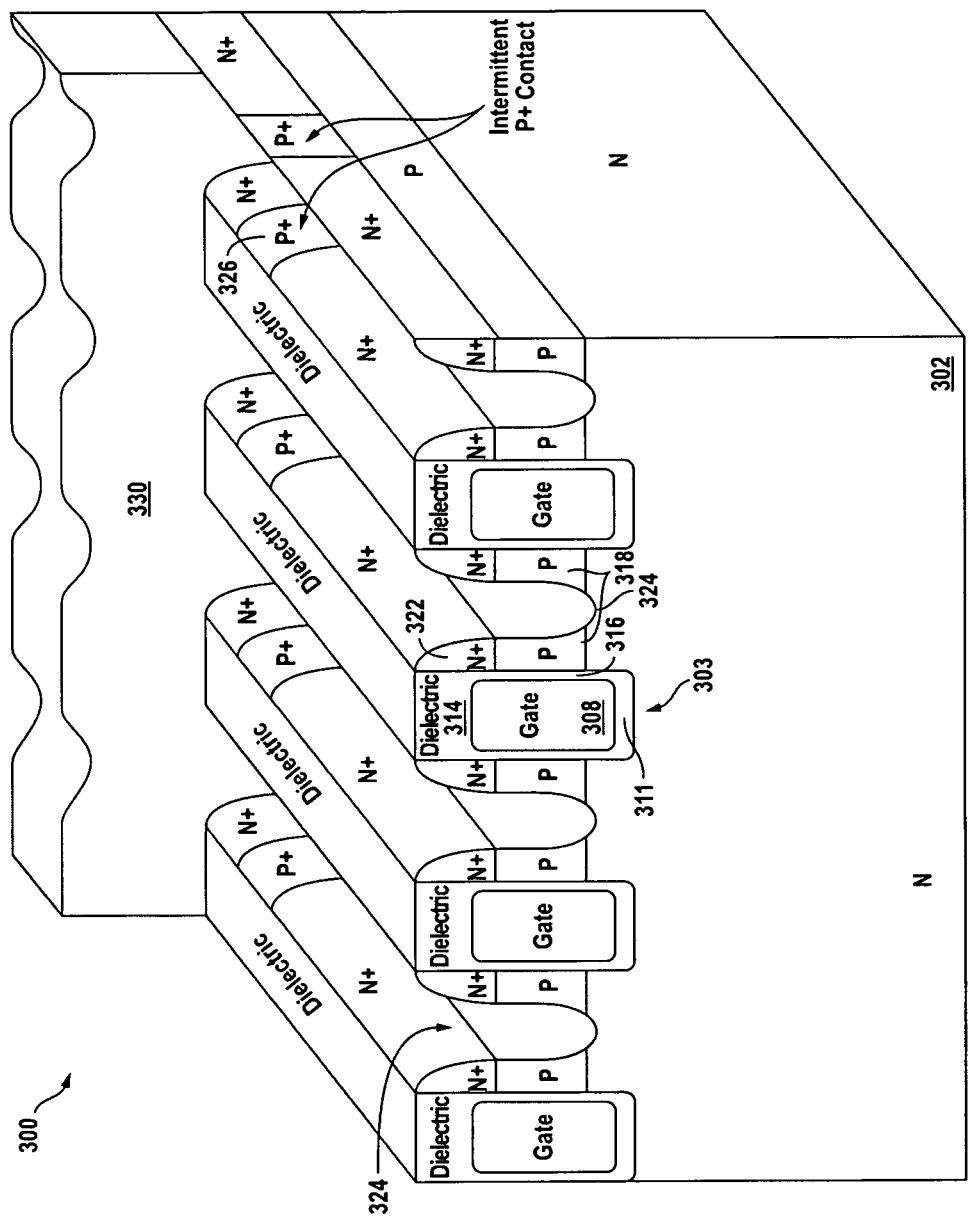
FIG. 3B is a simplified isometric view of a portion of an array of stripe-shaped cells of monolithically integrated trench gate FET and Schottky diode in accordance with an exemplary embodiment of the invention.

FIG. 3B shows the trench gate variation of the shielded gate structure depicted in FIG. 3A. The structure in FIG. 3B is similar to that in FIG. 3A except that the trenches in FIG. 3B do not include the shield electrode and thus do not extend as deep as the trenches in the FIG. 3B structure. Like conventional trench gate FET structures, trenches 303 in FIG. 3B include a gate electrode 308 with a thick dielectric 311 extending below the gate electrode. The thick bottom dielectric helps reduce the gate to drain capacitance Cgd. Alternatively, gate dielectric 316 extending along the trench sidewalls may extend along the trench bottom. In the absence of the shield electrode, the drift region in the FIG. 3B embodiment may need to have a lower doping concentration than the drift region in the FIG. 3A embodiment. Also, an implant region may be formed in the drift region directly below the Schottky contact to ensure the integrity of the Schottky diode as required. For an N-channel MOSFET this implant region would be a P-type implant to ensure a lightly doped surface concentration. And conversely for a P-channel MOSFET.

Figure 5A:
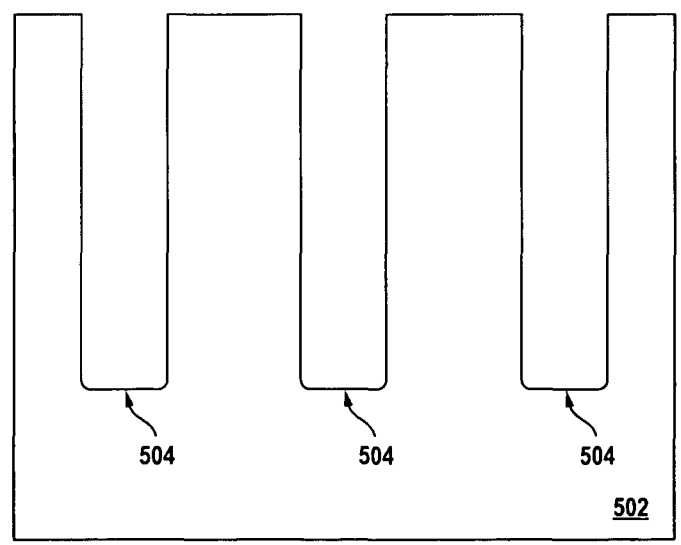
FIGS. 5A-5E are simplified cross section views illustrating a process sequence for forming the monolithically integrate shielded gate FET and Schottky diode shown in FIG. 3A, according to an exemplary embodiment of the present invention.

FIGS. 5A-5E are simplified cross section view diagrams illustrating an exemplary process sequence for forming the integrated FET-Schottky structure in FIG. 3A, according to an embodiment of the present invention. In FIG. 5A, N-type drift regions 502 overlying a silicon substrate (not shown) are formed using a conventional epitaxial process. A conventional deep trench etch process is performed to form trenches 504 extending into and terminating in drift region 502. It is noted that the trench etch process forms trench stripes extending in a direction perpendicular to the cross-sectional view diagram in FIG. 5A. In one embodiment, trenches 504 have a depth of about 2 µm. In some embodiments, the trench width is about 0.2-0.7 µm each, and the depth of each trench is in the range of 0.5-3.0 µm. These dimensions depend on the cell pitch within which the FET and Schottky diode are formed. Factors impacting these dimensions include the capabilities of the photolithographic equipment and the design and performance goals.

Figure 5B:
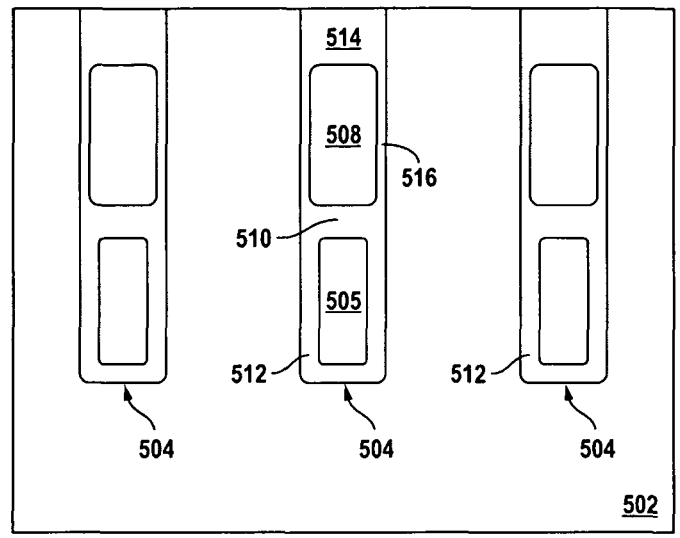

In FIG. 5B, a shield dielectric 512 lining lower sidewalls and bottom of trenches 504 is formed using conventional techniques. Shield electrodes 505 are then formed filling a lower portion of trenches 504 using known methods. An inter-electrode dielectric layer (IPD) 510 is then formed over shield electrode 505 using known methods. A gate dielectric 516 lining upper trench sidewalls is then formed using known methods. Gate dielectric 516 may be formed in an earlier stage of the process (e.g., at the time of forming IPD 510). Recessed gate electrodes 508 are formed filling an upper portion of trenches 504. Dielectric cap regions 514 extend over gate electrodes 508 and fill the remainder of trenches 504.

Figure 5C:
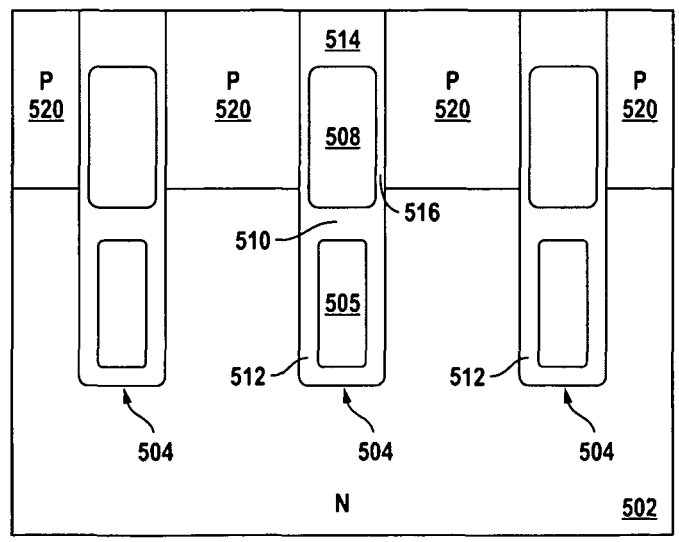

In FIG. 5C, P-type dopants are implanted into exposed silicon regions using conventional technique followed by a drive in process, thereby forming body regions 520. No mask is used in the active region in forming body regions 520.

Depending on the embodiments, the structure in FIG. 5C can be formed using different methods. For example, in one embodiment, before trench formation, P-type body region 520 is formed in the drift region 502 by either an ion implantation method or an epitaxial process. A deep trench etch process is then performed to form trenches 504 extending through P body regions 520 and terminating in N drift region 502. The shield electrode and gate electrode are then formed in a process similar to the process discussed above in connection with FIG. 5B.

Figure 5D:
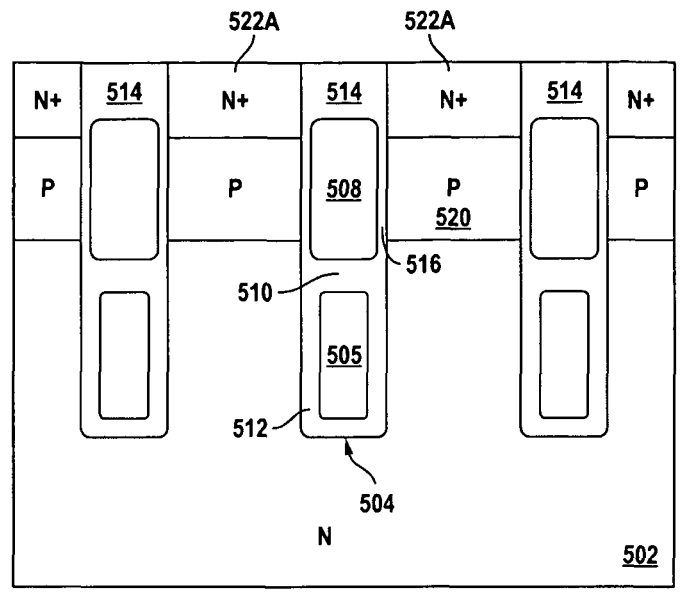

Next, in FIG. 5D, using known techniques, N-type dopants are implanted into exposed silicon regions followed by a drive in process, thereby forming N+ regions 522A. No mask is used in the active region in forming N+ regions 522A.

Figure 5E:
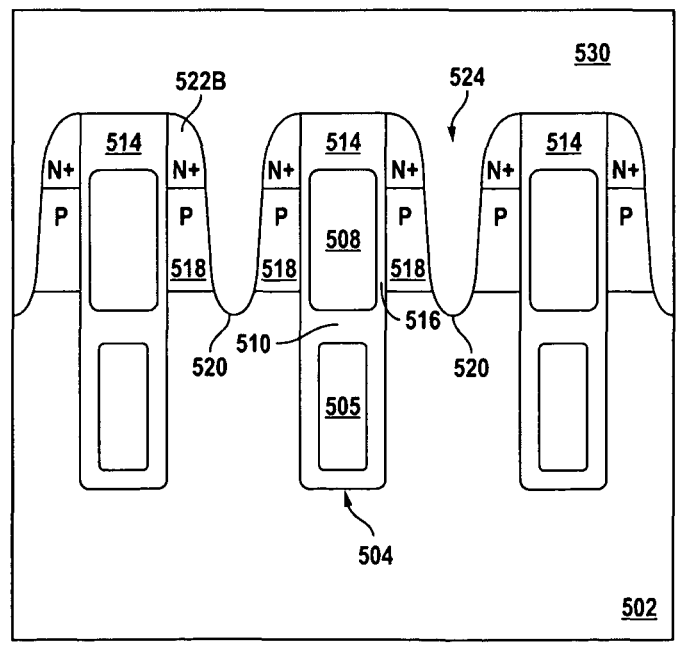

In FIG. 5E, without using a mask in the active region, a recess dimple etch process is performed to etch through N+ regions 522A such that outer portions 522B of N+ regions 522A are preserved. The preserved outer portions 522A form the source regions. A dimple 524 is then formed between every two adjacent trenches. Dimples 524 form recessed contact openings extending below source regions 522B and into drift regions 502. "Dimple etch" as used in this disclosure refers to silicon etch techniques which result in formation of silicon regions with sloped, rounded outer profiles as do source regions 522B in FIG. 5E. The dimple region also separates P-type region 520 into individual body regions 518 as shown in FIG. 5E. As indicated before, a deeper dimple results in formation of a Schottky contact in the drift region below the source regions and the body regions. This helps divert reverse avalanche current away from the source regions, thus preventing the parasitic bipolar transistor from turning on. Further, because no mask is used in the active region when forming body regions 518, source regions 522B, and recess 524, these features are formed in a self-aligned manner thus allowing the cell pitch to be substantially reduced. While the above dimple etch does not require a mask in the active region, in an alternate embodiment a mask is used to define a central portion of N+ regions 522A that is etched through to the desired depth. Outer portions of N+ regions 522A extending under such a mask are thus preserved. These outer regions form the source regions.

In a specific embodiment, using a masking layer, P-type dopants are implanted into the dimple region intermittently along each trench stripe. Islands of heavy body regions (similar to regions 326 in FIG. 3) are thus formed between every two adjacent trench. In one embodiment, a high enough dosage of P-type dopants need to be used during the heavy body implant in order to counter-dope those portions of the source regions where the heavy body regions are to be formed. In another embodiment, a lower dosage of P-type dopants needs to be used during the implant so that the source regions are not counter-doped and thus remain intact.

In FIG. 5E, conventional techniques can be used to form a Schottky barrier metal 530 over the structure. In one embodiment, Schottky barrier metal 530 fills dimples 524, and where metal 530 comes in electrical contact with drift regions 520, a Schottky diode is formed. Metal layer 530 also contacts source regions 522B and the heavy body regions. In one embodiment, prior to forming interconnect 530, dopants are implanted into drift region 502 along the bottom of each recess to adjust the doping concentration at the Schottky contact in order to insure the integrity of the Schottky contact.

In one embodiment, an electrical connection is formed between the source regions and the shield electrode. For example, an opening can be formed at an end of a trench strip to expose a shield electrode, and an interconnect material is then formed to contact the shield electrode and the source region. In an alternative embodiment, the shield electrode can be coupled to the interconnect material filling the recesses.

The process sequence depicted by FIGS. 5A-5E is a simple process for forming an integrated shielded gate trench FET-Schottky structure. The structure thus formed has many vertical and horizontal self-aligned features. In one embodiment, the shield electrode is electrically connected to the source regions, whereby the capacitive coupling, e.g. Qgd, is reduced. In one specific embodiment, the drift region and the body region are formed by epitaxial processes. The double epi structure provides design flexibility enabling optimization of the breakdown voltage and the on resistance. Of course, there are many other variations, modifications, and alternatives. An example of alternative techniques is discussed below.

The process for forming the structure shown in FIG. 3B is similar to that depicted by FIGS. 5A-5E except for some of the process steps. One skilled in the art would know how to modify the process sequence depicted by FIGS. 5A-5E to form the structure in FIG. 3B. For example, in the process for forming the FIG. 3B structure, shallower trenches are formed and the process steps associated with forming the shield electrode and the IPD are terminated.

Figure 6A:
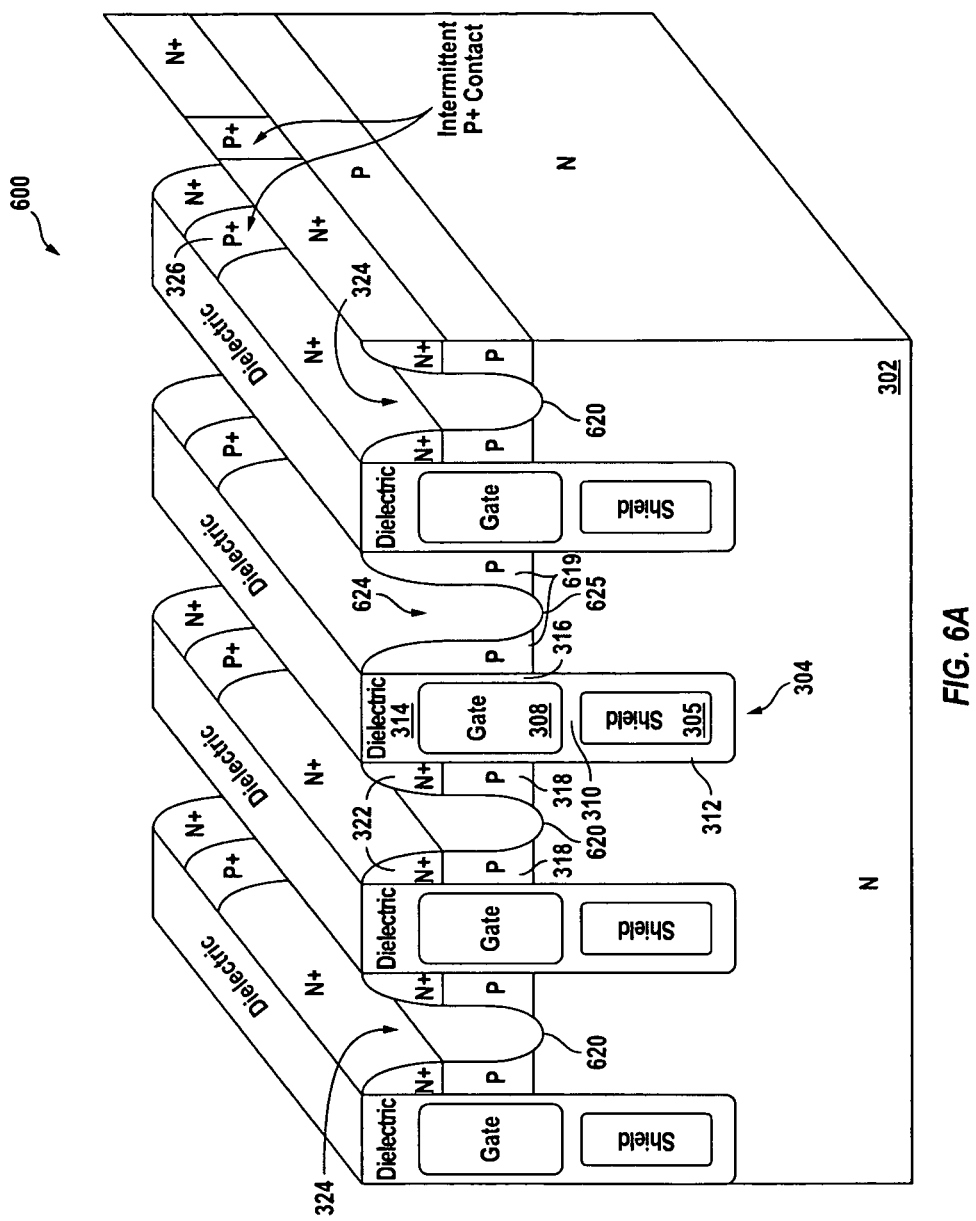
FIG. 6A is a simplified isometric view of a portion of an array of stripe-shaped cells of monolithically integrated shielded gate FET and Schottky diode in accordance with an exemplary embodiment of the invention.

FIG. 6A is an exemplary simplified isometric view of a portion of an array of stripe-shaped cells each having a trench FET and a Schottky diode integrated therein, in accordance with an alternative embodiment of the invention. Integrated device 600 is similar to device 300 in FIG. 3A, with corresponding components marked with the same numerals as in FIG. 3A. As shown in FIG. 6A, integrated device 600 includes FETs formed by N-type drift region 302, p-type body region 318, N-type source region 322, shield electrode 305, and gate electrode 308. Integrated device 600 also includes Schottky diodes 620 formed at bottom of recess dimple regions 324 between drift region 302 and a Schottky metal (not shown). Additionally, integrated device 600 also includes Schottky diode 625 formed in a region between two trenches where no source regions are present. Instead P-type body regions 619 extend to the top of the trenches. The absence of source regions associated with Schottky diode 625 increases the device ratio between Schottky diode and FET. By providing dedicated Schottky regions 625, the percentage of the Schottky diode area relative to the FET area can be varied. This design flexibility is useful in certain device applications where certain Schottky-FET ratios are needed. Also, because body regions 619 extend along the trench sidewalls, capacitive coupling, for example, Qgd, is reduced, compared to a conventional Schottky diode formed in a drift region as in the prior art FIG. 2 structure.

Figure 6B:
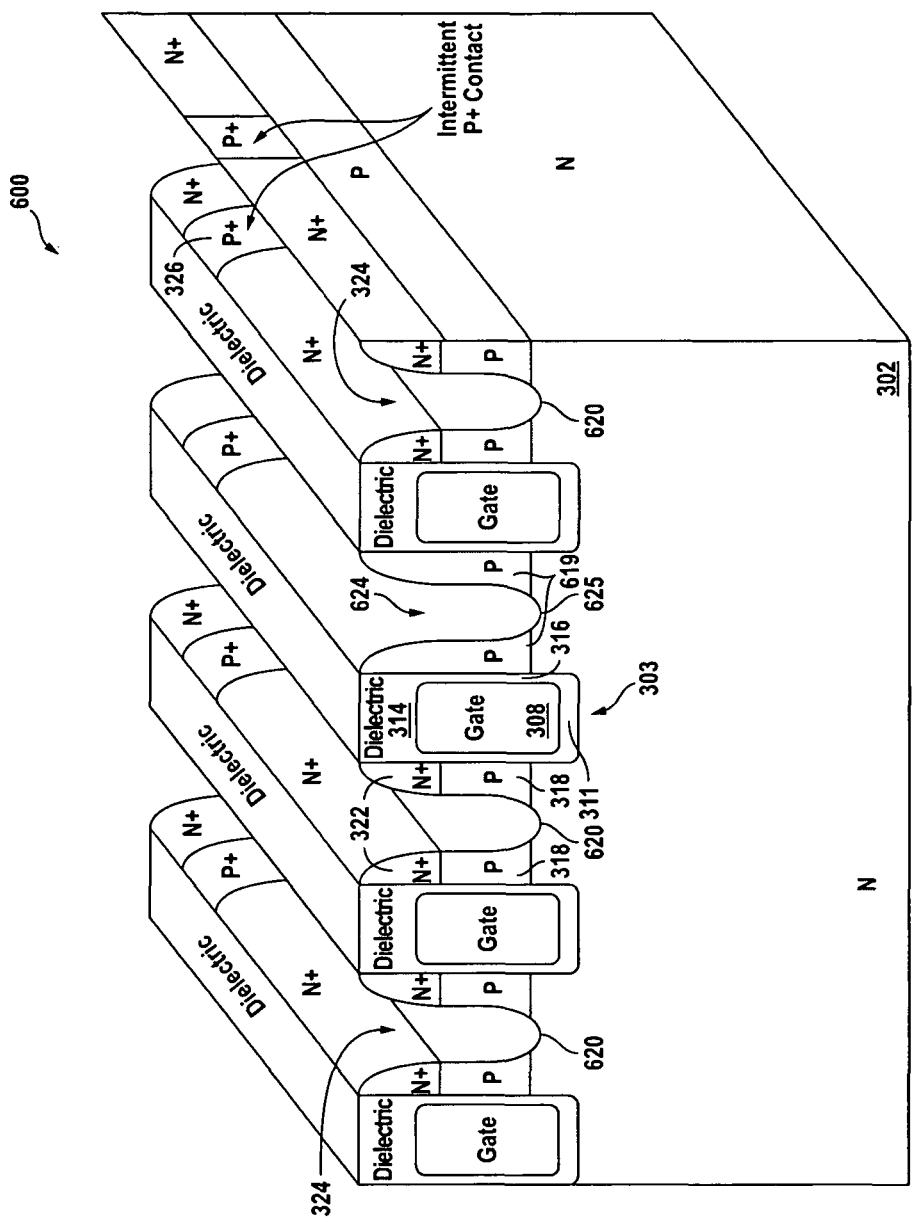
FIG. 6B is a simplified isometric view of a portion of an array of stripe-shaped cells of monolithically integrated trench gate FET and Schottky diode, in accordance with an exemplary embodiment of the invention.

FIG. 6B shows the trench gate variation of the shielded gate structure depicted in FIG. 6A. The structure in FIG. 6B is similar to that in FIG. 6A except that the trenches in FIG. 6B do not include the shield electrode and thus do not extend as deep as the trenches in the FIG. 6B structure. Like conventional trench gate FET structures, trenches 303 in FIG. 6B include a gate electrode 308 with a thick dielectric 311 extending below the gate electrode. Alternatively, gate dielectric 316 extending along the trench sidewalls may extend along the trench bottom. In the absence of the shield electrode, the drift region in the FIG. 6B embodiment may need to have a lower doping concentration than the drift region in the FIG. 6A embodiment. Also, an implant region may be formed in the drift region directly below the Schottky contact to ensure the integrity of the Schottky diode as required.

Figure 7A:
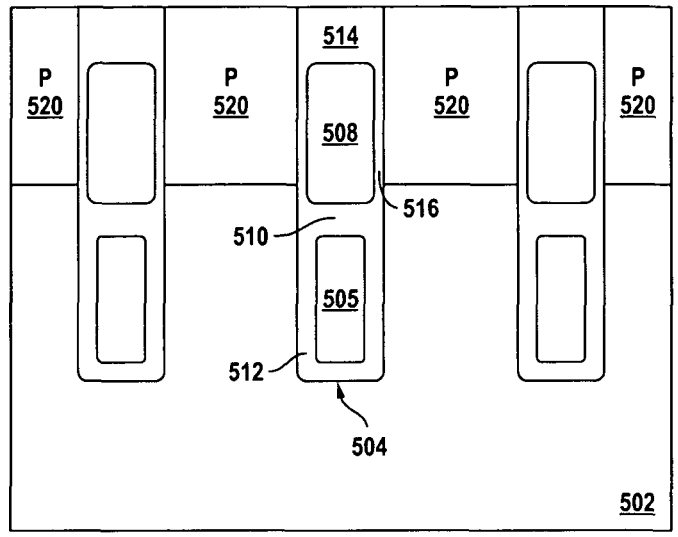
FIGS. 7A-7C are simplified cross section views illustrating a process sequence for forming the monolithically integrated shielded gate FET and Schottky diode shown in FIG. 6A, according to an exemplary embodiment of the present invention.
Figure 7B:
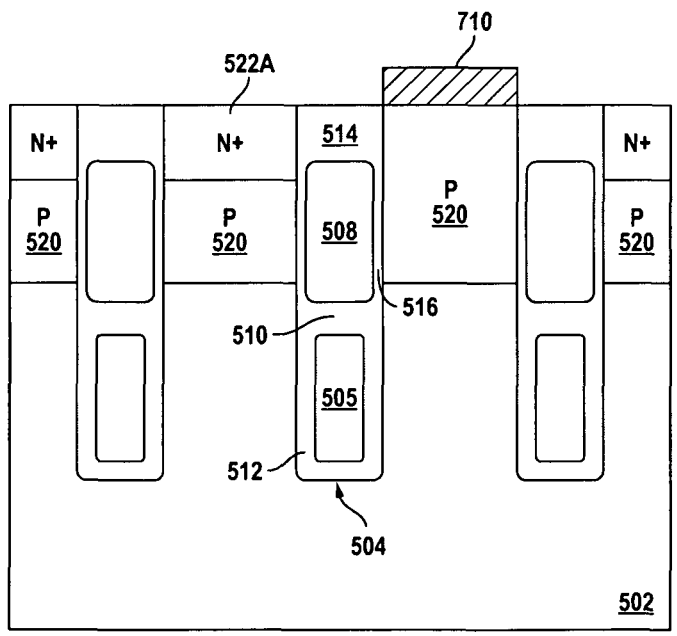
Figure 7C:
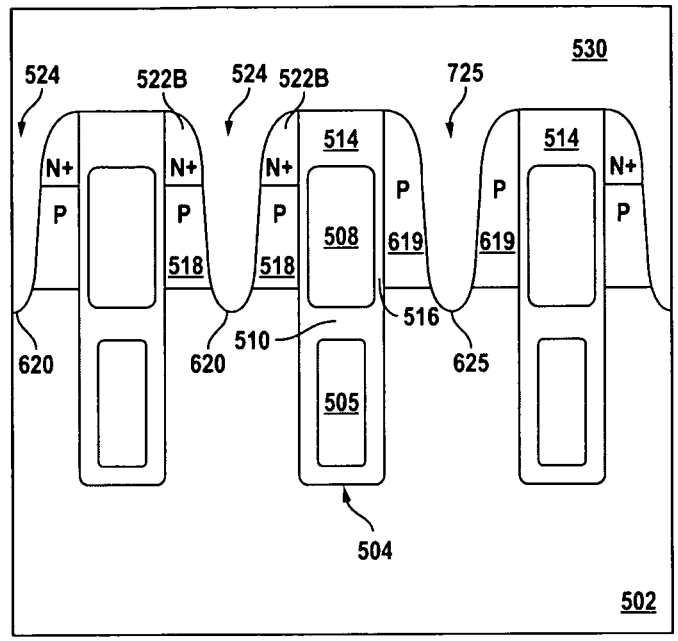

FIGS. 7A-7C are simplified cross section views illustrating an exemplary process sequence for forming the monolithically integrated trench FET and Schottky diode shown in FIG. 6A, according to an embodiment of the present invention. FIG. 7A is a simplified drawing illustrating an intermediate device structure similar to that shown in FIG. 5C before the N+ source implant. The same process techniques and their variations described above in connection with FIGS. 5A-5C may be used in forming the intermediate structure shown in FIG. 7A.

In FIG. 7B, a mask region 710 is formed before the N+ source implant, in contrast to the mask-less implant in FIG. 5D. As shown, N+ source regions 522A are formed in regions not covered by mask region 710. Under mask 710, the P-type region is preserved, and no source regions are formed therein. Note that mask 710 may extend over dielectric caps 514 and as such the alignment of mask 710 to its underlying body region 520 is not critical so long as mask 710 fully covers its underlying body region 520.

In FIG. 7C, recess dimple regions 524 and 725 are formed between adjacent trenches, and then metal layer 530 are formed using processes similar to those described in connection with FIG. 5E. Dimple regions 524 separate N+ region 522A into source regions 522B, and also separate P-type regions 520 into body regions 518. Dimple regions 725 separate corresponding P-type regions 520 into two P-type regions 619, which will be referred to herein as either body regions 619 or well regions 619. As noted no source regions are formed adjacent to dimple region 725. As shown in FIG. 7C, Schottky diodes 620 are formed between FETs in regions having N+ source regions 522B. In regions masked out by mask region 710 in FIG. 7B, Schottky diode 625 is formed between drift region 502 and metal layer 530, and P-type body regions 619 extend to the top of the trenches 504. No FET is formed adjacent to Schottky diode 625. Accordingly the mask region 710 can be designed to prevent formation of a FET in certain regions. As noted above, this design flexibility is useful in certain device applications when certain device ratios are needed. In the dedicated Schottky regions, because body regions 619 are disposed along the trench sidewalls, capacitive coupling, for example, Qgd, is reduced, compared to a conventional Schottky diode formed in a drift region.

Figure 8A:
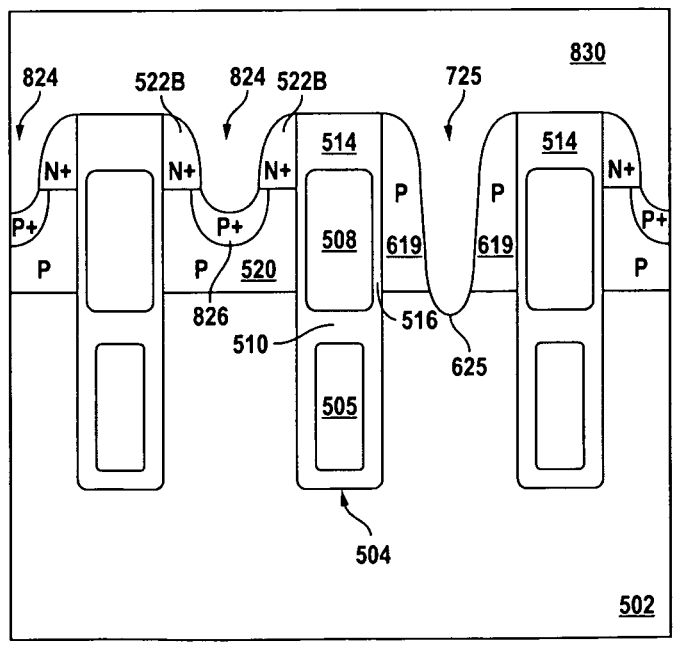
FIG. 8A is a simplified cross section view of a monolithically integrated shielded gate FET and Schottky diode in accordance with an exemplary embodiment of the invention.

FIG. 8A is a simplified cross section view of yet another embodiment of the invention. Unlike prior embodiments, dimples 824 in the FET regions do not extend into drift region 502, but rather terminate in body region 520 as shown. A heavy body region 826 is formed in body region 818 along the bottom of each dimple 824. Thus, no Schottky contact is formed at the bottom of dimples 824. However, dimples 725, as in the FIG. 7C embodiment, extend through the body region and terminate in drift region 502, allowing Schottky contact to be formed between interconnect layer 830 and drift region 502 along the bottom of dimples 725. As in prior embodiments, the bottom of dimples 725 may be implanted with dopants to enhance the characteristics of the Schottky diode.

The structure in FIG. 8A may be formed using the exemplary process sequence depicted by FIGS. 7A-7C with the following modifications. After forming the structure shown in FIG. 7B, a two step dimple etch process may be carried out to form dimples 824 and 725. An initial dimple etch of all P-type regions 520 is carried out to form dimples terminating in P-type regions 520 at a depth similar to the depth of dimples 824 in FIG. 8. A masking layer is then used to cover all FET regions but not P-type body regions where Schottky diodes are to be formed (e.g., the reverse of mask 710 in FIG. 7B may be used). A second dimple etch is carried out to further extend the dimples in the body regions exposed through the masking layer into drift region 502 to thereby form dimples 725 as shown in FIG. 8A. Similar process steps to those described in connection with one or more of the above embodiments may be used to complete the structure.

In an alternate process embodiment, two masking steps may be used in forming dimples 824 and 725. First, P-type regions 520 corresponding to where the Schottky diodes are to be formed are covered by a masking layer and a dimple etch of the exposed P-type regions is carried out to form dimples 824. Second, P-type regions 520 corresponding to where the FETs are to be formed are covered by a masking layer and a dimple etch of the exposed P-type regions is carried out to form dimples 824. These two masking steps may be carried out in the opposite order.

In the FIG. 8A structure, source regions and body regions are formed in a self-aligned manner enabling shrinking of the cell pitch. Further, as in the FIG. 6 embodiment, with body regions 619 extending along gate electrodes 508 in the Schottky regions, the Qgd is reduced. A further advantage of the FIG. 8 embodiment is by completely decoupling the FET region and the Schottky region from one another, any ratio of FET to Schottky may be obtained. This embodiment may particularly be advantageous for applications where a small ratio of Schottky to FET in the range of 2.5-5% is desired.

Figure 8B:
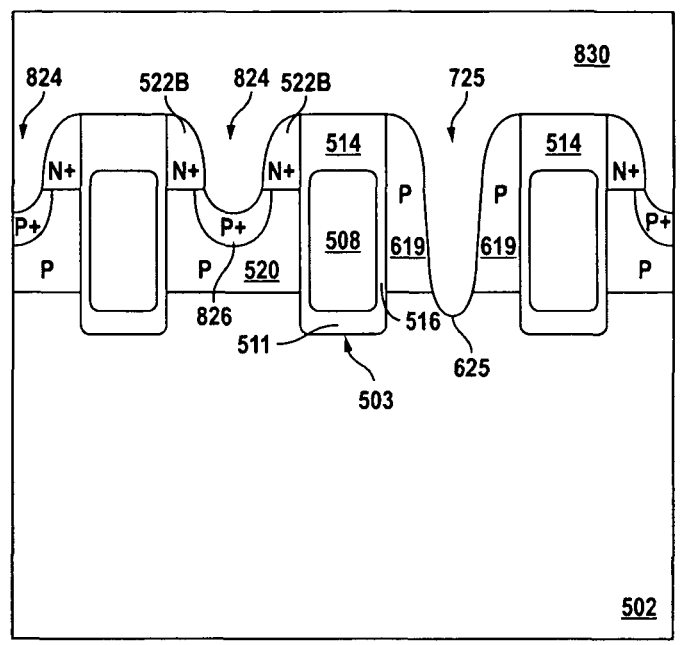
FIG. 8B is a simplified cross section view of a monolithically integrated trench gate FET and Schottky diode in accordance with an exemplary embodiment of the invention.

FIG. 8B shows the trench gate variation of the shielded gate structure depicted in FIG. 8A. The structure in FIG. 8B is similar to that in FIG. 8A except that the trenches in FIG. 8B do not include the shield electrode and thus do not extend as deep as the trenches in the FIG. 8A structure. Like some conventional trench gate FET structures, trenches 503 in FIG. 8B include a gate electrode 508 with a thick dielectric 511 extending below the gate electrode. Alternatively, gate dielectric 516 extending along the trench sidewalls may extend along the trench bottom. In the absence of the shield electrode, the drift region in the FIG. 8B embodiment may need to have a lower doping concentration than the drift region in the FIG. 8A embodiment. Also, an implant region may be formed in the drift region directly below the Schottky contact to ensure the integrity of the Schottky diode as required.

In today's electronic devices it is common to find the use of multiple power supply ranges. For example, in some applications, central processing units are designed to operate with a different supply voltage at a particular time depending on the computing load. Consequently, dc/dc converters have proliferated in electronics to satisfy the wide ranging power supply needs of the circuitry. Common dc/dc converters utilize high efficiency switches typically implemented by power MOSFETs. The power switch is controlled to deliver regulated quanta of energy to the load using, for example, a pulse width modulated (PWM) methodology.

Figure 9:
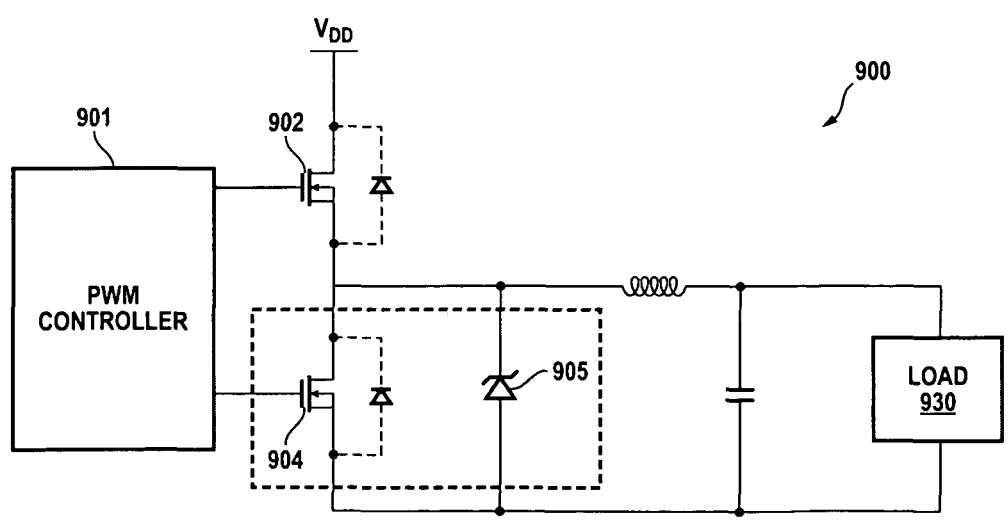
FIG. 9 is a simplified circuit diagram illustrating a dc/dc converter incorporating a monolithically integrated power FET and Schottky diode according to embodiments of the present invention.

FIG. 9 is a simplified circuit schematic illustrating a dc/dc converter 900 including a monolithically integrated trench MOSFET and Schottky diode in accordance with an embodiment of the present invention. A PWM controller 901 drives the gate terminals of a pair of power MOSFETs 902 and 904 to regulate the delivery of charge to the load 930. In a specific embodiment, the combination of FET 904 and Schottky diode 905 is implemented as an integrated device similar to the monolithically integrated trench MOSFET and Schottky diode shown in any of FIGS. 3A, 3B, 6A, 6B, 8A and 8B. MOSFET 904 is used in the circuit as a synchronous rectifier. In order to avoid shoot-through current, both switches must be off simultaneously before one of them is turned on. During this "dead time," the internal diode of each MOSFET switch, commonly referred to as body diode, can conduct current. Unfortunately the body diode has relatively high forward voltage and energy is wasted. As shown in FIG. 9, Schottky diode 905 is in parallel with the MOSFET 904 body diode. Because a Schottky diode has lower forward voltage than the body diode, Schottky diode 905 results in improved power consumption and improve the conversion efficiency.

While some embodiments of the invention have been described using shielded gate and trench gate FETs, implementation of the invention in other shielded gate FET structures and trench gate FETs with thick bottom dielectric as well as other types of power devices would be obvious to one skilled in this art in view of this disclosure.

Although a number of specific embodiments are shown and described above, embodiments of the invention are not limited thereto. For example, while some embodiments of the invention are described using the open cell structure, implementing the invention using closed cell structures with various geometric shapes such as polygonal, circular, and rectangular, would be obvious to on skilled in this are in view of this disclosure. Further, while the embodiments of the invention are described using n-channel devices, the conductivity type of the silicon regions in these embodiments can be reversed to obtain p-channel devices. Moreover, IGBT variations of the various types of n-channel and p-channel FETs referenced above may be obtained by merely reversing the polarity of the substrate. Therefore, the scope of the present invention should be determined not with reference to the above description but should, instead, be determined with reference to the appended claim, along with their full scope of equivalents.

What is claimed is:

1. A semiconductor structure including a monolithically integrated trench FET and Schottky diode, the semiconductor structure comprising:
   a plurality of trenches extending into a semiconductor region of a first conductivity type;
   a gate electrode in each trench;
   first and second body regions of a second conductivity type over the semiconductor region between first and second pair of adjacent trenches, respectively;
   a source region of the first conductivity type over the first body region;
   a recess extending between each of the first and second adjacent trenches and terminating in the semiconductor region at a depth below the first and second body regions; and
   an interconnect layer electrically contacting exposed surfaces of the source region and the first and second body regions in each recess, the interconnect layer further contacting the semiconductor region along a bottom of each recess to form a Schottky contact therebetween, the interconnect layer forming an anode terminal of the Schottky diode and a source electrode of the FET.

2. The semiconductor structure of claim 1 the first body region has an upper surface below an upper surface of the gate electrode, and the second body region vertically extends above the upper surface the gate electrode.

3. The semiconductor structure of claim 1 wherein each recess has tapered edges and is self aligned with the trenches.

4. The semiconductor structure of claim 1 further comprising:
   a shield electrode in a lower portion of each trench below the gate electrode, the shield electrode being insulated from the semiconductor region by a shield dielectric;
   an inter-electrode dielectric extending between the shield electrode and gate electrode in each trench; and
   a gate dielectric lining upper trench sidewalls of each trench.

5. The semiconductor structure of claim 1 wherein the gate electrode is recessed in each trench and is capped with a dielectric material.

6. The semiconductor structure of claim 1 wherein the interconnect layer further comprises a barrier metal layer which forms a Schottky contact with the semiconductor region along a bottom of each recess.

7. The semiconductor structure of claim 1 further comprising a thick bottom dielectric below the gate electrode in each trench.

8. The semiconductor structure of claim 1 further comprising a plurality of heavy body regions of the second conductivity type over and in contact with the first body region.

9. The semiconductor structure of claim 1 wherein during operation, a conduction channel is formed in the first body region but not in the second body region.

10. The semiconductor structure of claim 1 wherein when the FET is turned on, a current flows through the first body region but not through the second body region.

11. The semiconductor structure of claim 1 further comprising a doped region in the semiconductor region along the bottom of each recess where the Schottky contact is formed.

12. A semiconductor structure comprising a monolithically integrated trench FET and Schottky diode, the semiconductor structure further comprising:
   a plurality of trenches extending into a semiconductor region of a first conductivity type;
   a gate electrode in each trench;
   first and second body regions of a second conductivity type over the semiconductor region between a first and second pair of adjacent trenches, respectively;
   source regions of the first conductivity type over the first body region;
   a first recess extending between the first pair of trenches and terminating in the first body region at a depth below the source regions;
   a second recess extending between the second pair of trenches and terminating in the semiconductor region at a depth below the second body regions; and
   an interconnect layer electrically contacting exposed surfaces of the source regions and the first and second body regions in each of the first and second recesses, the interconnect layer further contacting the semiconductor region along a bottom of the second recess to form a Schottky contact therebetween, the interconnect layer forming an anode terminal of the Schottky diode and a source electrode of the FET.

13. The semiconductor structure of claim 12 further comprising:
   a shield electrode in a lower portion of each trench below the gate electrode, the shield electrode being insulated from the semiconductor region by a shield dielectric;
   an inter-electrode dielectric extending between the shield electrode and gate electrode in each trench; and
   a gate dielectric lining upper trench sidewalls of each trench.

14. The semiconductor structure of claim 12 further comprising a thick bottom dielectric below the gate electrode in each trench.

15. A semiconductor structure, comprising:
   a plurality of trenches extending into a semiconductor region of a first conductivity type;
   a gate electrode in each trench;
   one or more trench FET regions, each trench FET region including:
      a first body region of a second conductivity type over the semiconductor region between a first pair of adjacent trenches;
      a source region of the first conductivity type over the first body region; and
      a first recess extending between the first pair of adjacent trenches and terminating in the first body region at a depth below the source region;
   one or more Schottky regions, each Schottky region including:
      a second body region of a second conductivity type over the semiconductor region between a second pair of adjacent trenches; and
      a second recess extending between the second pair of adjacent trenches and terminating in the semiconductor region at a depth below the second body region, wherein the second body region extends to a top region of the second recess; and
   an interconnect layer extending into the first recess and the second recess, wherein the interconnect layer contacts a bottom of the second recess in the Schottky region to form a Schottky diode, and the interconnect layer contacts surfaces of the source region and the first body region in the trench FET region, the interconnect layer forming a terminal of the Schottky diode and an electrode of the FET.

16. The semiconductor structure of claim 15, wherein the number of the trench FET regions is greater or less than the number of the Schottky regions.

17. A semiconductor structure, comprising:
   a plurality of trenches extending into a semiconductor region of a first conductivity type;
   a gate electrode in each trench;
   one or more trench FET regions, each trench FET region including:
      a first body region of a second conductivity type over the semiconductor region between a first pair of adjacent trenches;
      a source region of the first conductivity type over the first body region; and
      a first recess extending between the first pair of adjacent trenches and terminating in the semiconductor region at a depth below the first body region;
   one or more integrated device regions, each integrated device region including:
      a second body region of a second conductivity type over the semiconductor region between a second pair of adjacent trenches; and
      a second recess extending between the second pair of adjacent trenches and terminating in the semiconductor region at a depth below the second body region, wherein the second body region extends to a top region of the second recess; and
   an interconnect layer extending into the first recess and the second recess and contacting the semiconductor region at bottoms of the first recess and the second recess to form Schottky contacts, wherein the interconnect layer contacts surfaces of the source region and the first body region in the trench FET region and contacts a surface of the second body region in the integrated device region.

18. The semiconductor structure of claim 17, wherein the number of the trench FET regions is greater or less than the number of the integrated device regions.

* * * * *